United States Patent [19]

Donohoue et al.

[11] Patent Number: 5,067,820
[45] Date of Patent: Nov. 26, 1991

[54] RADIONUCLIDE CALORIMETER SYSTEM

[75] Inventors: Thomas P. Donohoue, Denver; Christopher P. Oertel, Arvada; William H. Tyree, Boulder; Joe L. Valdez, Denver, all of Colo.

[73] Assignee: The United States of America as represented by the United States Department of Energy, Washington, D.C.

[21] Appl. No.: 540,240

[22] Filed: Jun. 19, 1990

[51] Int. Cl.⁵ .............................................. G01K 17/08
[52] U.S. Cl. ...................................... 374/31; 422/51; 374/10
[58] Field of Search ............... 374/11, 10, 31, 163, 374/166, 183, 185, 8, 37, 34; 324/98; 338/324; 422/51; 73/768, 718, 32 R

[56] References Cited

U.S. PATENT DOCUMENTS

| 3,467,501 | 9/1969 | Groszek | 422/51 |
| 3,593,577 | 7/1971 | Monner | 374/34 |
| 3,657,630 | 4/1972 | Fiet | 73/718 |
| 3,747,396 | 7/1973 | O'Neill | 374/11 |
| 3,934,127 | 2/1976 | Schlatter et al. | 73/32 R |
| 4,059,007 | 11/1977 | Miller et al. | 374/8 |
| 4,255,962 | 3/1981 | Ashman | 374/10 |
| 4,321,224 | 2/1982 | Domen | 374/31 |
| 4,329,873 | 5/1982 | Maeda | 374/37 |
| 4,653,934 | 3/1987 | Pursley | 374/31 |
| 4,831,881 | 5/1989 | Jeon et al. | 73/768 |

Primary Examiner—William A,. Cuchlinski, Jr.
Assistant Examiner—G. Bradley Bennett
Attorney, Agent, or Firm—Karla Ojanen; James H. Chafin; William R. Moser

[57] ABSTRACT

A circuit for measuring temperature differentials in a calorimeter is disclosed. The temperature differential between the reference element and sample element containing a radioactive material is measured via a wheatstone bridge arrangement of thermistors. The bridge is driven with an alternating current on a pulsed basis to maintain the thermal floor of the calorimeter at a low reference value. A lock-in amplifier connected to the bridge phase locks a signal from the bridge to the input pulsed AC signal to provide a DC voltage. The DC voltage is sampled over time and provided to a digital computer. The digital computer, using curve fitting algorithms, will derive a function for the sample data. From the function, an equilibrium value for the temperature may be calculated.

11 Claims, 4 Drawing Sheets

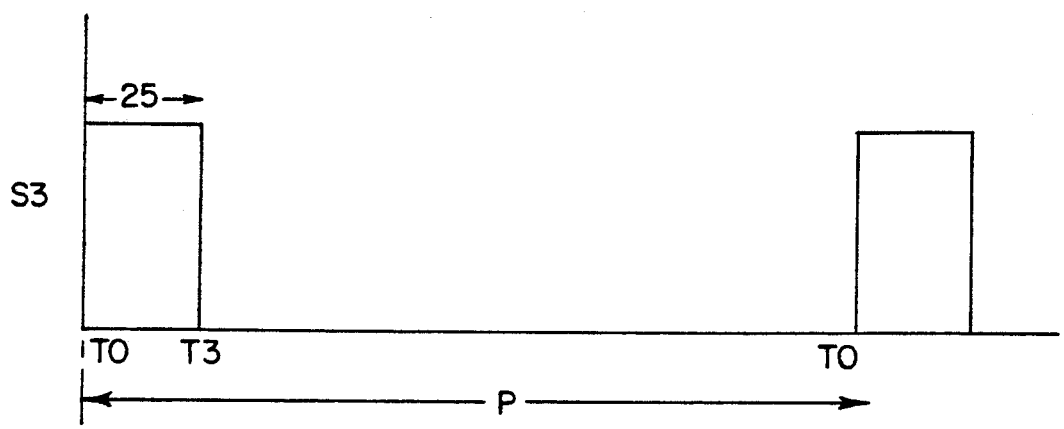
FIG. 2A
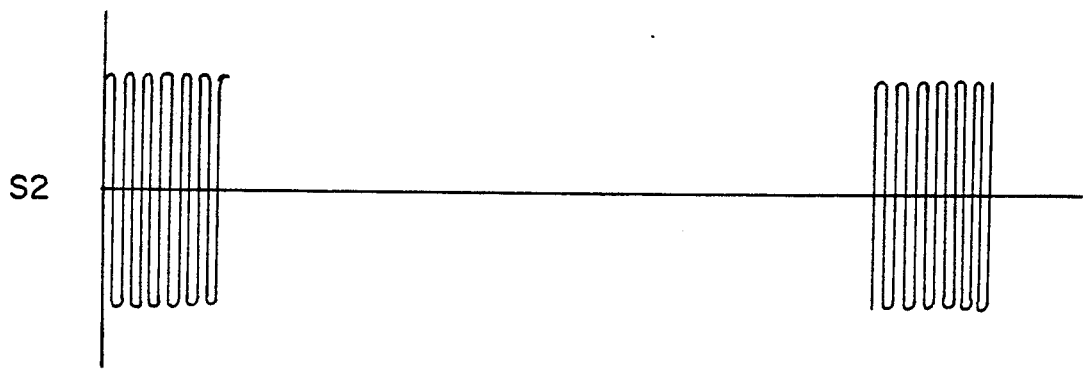
FIG. 2B
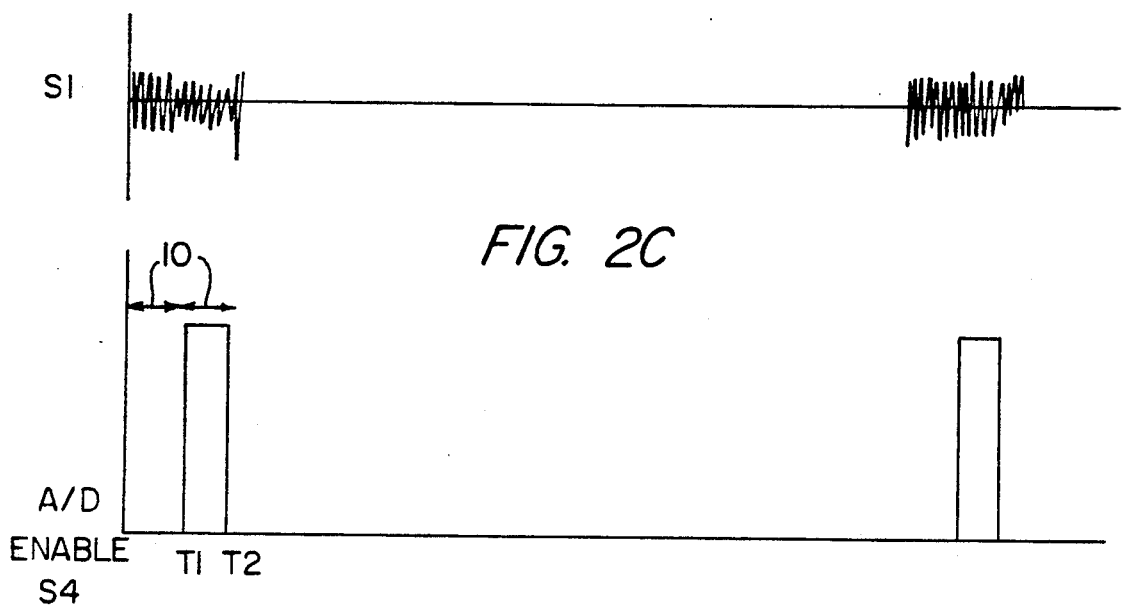
FIG. 2C
FIG. 2D

RADIONUCLIDE CALORIMETER SYSTEM

BACKGROUND OF THE INVENTION

The present invention relates to instrumentation for measuring small electrical sensor currents. Specifically, a circuit for measuring resistance bridge currents generated in response to a temperature differential produced between arms of a resistance bridge radionuclide calorimeter is described. The United States Government has rights in this invention pursuant to Contract No. DE-AC04-76DP03533, between the United States Department of Energy and EG&G Rocky Flats, Inc. (formerly Rockwell International).

Radionuclide calorimeters are employed to measure the radioactivity of a sample of radioactive material or processed waste. For the past forty years, production radiometric isothermal heat flow calorimeters have used water as their heat sink. The isothermal condition provided by the water is necessary to achieve the precise measurements required during assay of nuclear materials. The radiometric isohtermal calorimeter measures the heat flow produced by the decsay of a radioactive sample. As the sample decays, all of the alpha particles and some of the beta particles generated are trapped within the sample container. These particels produce heat, and when the sampel is placed in the calorimeter, cause a temperature rise in the power measuring area of the calorimeter. The heat produced flows through the sensing element of the calorimeter into the isothermal environmental bath. The temeprature rise cotinues unitl an equilibrium gap is equal to the heat being produced by the radionuclide sample.

An isothermal calorimeter uses a Wheatstone bridge as the sensing element to mearure the heat output of the radioactive sample. The radioactive the material is placed in a sample container comprising a first thermal element of the calorimeter. A second thermal element is located adjacent the sample container. The two elements of the calorimeter are separated by a constant temperature bath. Two nickel resistance thermometers are wound over each thermal element and connected in a circuit comprising a wheatstone bridge configuration. Nickel demonstrates a linear change in electrical resistance with respect to temperature. Two arms of the bridge are held at a constant temeprature by the isothermal environment, while the other two arms are located outside the power measuring area of the calorimeter. Thus, when a radioactive sample is placed in the calorimeter, the inner arms of the bridge are exposed to a rise in temperature caused by the sample heat, while the outer arms are held at a constant temperature by the isohtermal bath. This creates an imbalance in the Wheatstone bridge that can be measrued as the voltage at the output terminals of the bridge. When the heat flow within the claorimeter equilibrates, the bridge output indicates the heat output of the sample. The bridge circuit is energized with an electrical current. A temperature differential between thermal elements is constantly measured by monitoring the current through the wheatstone bridge. Differences in temperature at each thermal element unbalance the bridge, permitting accurate measurement of the relative temperature differential.

When a radioactive sample is introduced into the sample container, the temperature differential between the thermal elements will initially rise and then decay. The process by which equilibration occurs includes a long period of time to allow the various heat sources, i.e., the radioactive sample, and the various heat absorbers, e.g., the sample enclosure and enclosure containment inside the power measuring area of the calorimeter, to equaize. The voltage which is produced by the Wheatstone bridge reflects the amount of heat output from the unkonwn sample in the measuring area of hte calorimeter. The voltage that is produced is compared to the voltage produced from radioactive heat sources having well known power output. This comparison will produce an effective power from the unknown heat sample. The temperature decay will stabilize after many hours, typically 18 hours or more, to a level where the heat generated by the radioactive sample equals the heat loss through the thermal circuit comprising the thermal elements and constant temperature bath. The stabilized temperature is taken as a measure of the amount of heat being generated by the sample. The extended length of time needed to permit thermal stabilization is a major disadvantage presented by the calorimeter heat measuring techniques.

The measurement of radioactive samples having a low radioactivity level is made difficult by the heating effects of the bridge elements. The additional heat added to the sample container by power dissipation of the bridge elements tends to raise the thermal floor in the device, obscuring accurate temperature measurements of small increases in temperature.

SUMMARY OF THE INVENTION

It is an object of this invention to reduce the time needed to obtain accurate calorimetric measurements of a radioactive sample.

It is a more specific object of this invention to provide an accurate prediction of a stabilized calorimeter differential temperature measurement resulting from heat ouptu of a radionculide sample.

It is yet another object of this invention to decrease the low level temperature floor in a water bath radionuclide calorimeter.

These and other objects of the invention are realized with a bridge measurement circuit in accordance with the invention. The circuit provides an accurate measurement of the temperature differential between thermal elements of a calorimeter.

In carrying out the invention in accordance with a preferred embodiment, an alternating voltage signal is applied to the resistance bridge to provide a measuring current through the resistance bridge of the calorimeter. A lock-in amplifier detects the measurement signal provided by the bridge, providing a smooth signal representing the temperature differential. The lock-in amplifier phase locks the signal driving the bridge with the measurement signal returned from the bridge to obtain a smooth signal representing the current measured differential temperature for the calorimeter. The signal is sampled at periodic intervals and a number of points representing a temperature versus time decay function are obtained. Using a computer, a best fitting function may be obtained for this data. The obtained best fitting function is used to predict an end-point temperature, avoiding the lengthy 18-hour wait to obtain a stabilized temperature differential.

In accordance with the preferred embodiment, the applied resistance bridge signal is pulsed at intervals which reduce the heat added to the calorimeter from the power dissipation in the bridge. The reduced power dissipation in the bridge elements lowers the thermal floor of the calorimeter, permitting the measurement of radioactive samples having a lower power level than heretofore obtained.

DESCRIPTION OF THE FIGURES

FIGS. 2A-D illustrate the signals generated by the device of FIG. 1.

DESCRIPTION OF THE PREFERRED EMBODIMENT

Figure 1:
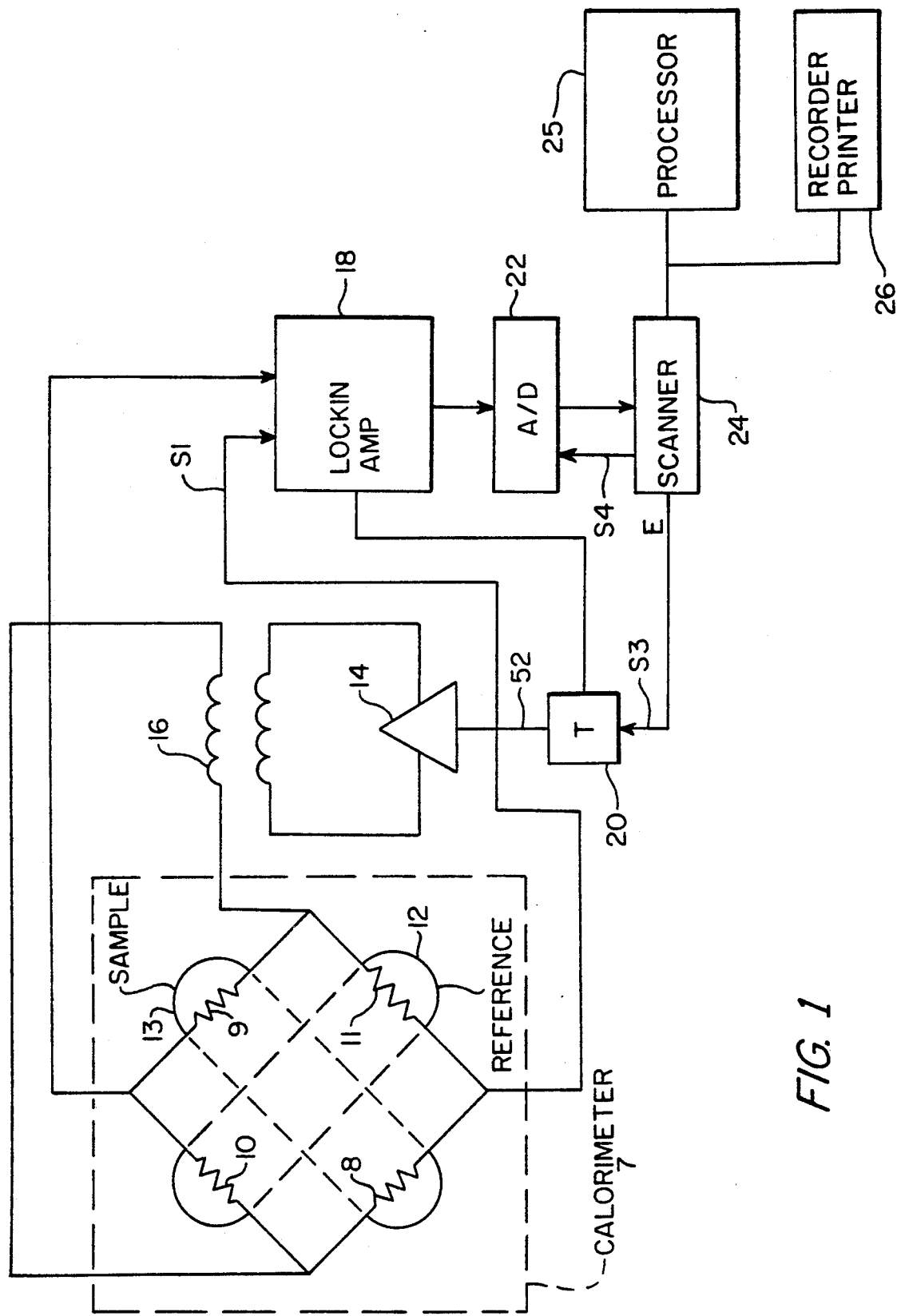
FIG. 1 is a schematic diagram illustrating a preferred embodiment of a measuring circuit in accordance with the invention.

Referring now to FIG. 1, there is shown an electrical schematic diagram representing the circuit used to derive temperature indication signals from a calorimeter 7. The calorimeter 7 is a typical isothermal twin bridge calorimeter. This calorimeter, known in the art as a "Mound Laboratory Calorimeter", includes a sample compartment shown generally as 13, and a reference compartment 12. The known calorimeter 7 provides a thermal circuit between the sample compartment 13 and reference compartment 12. Associated with each of the sample and reference compartments 12 and 13 are resistive elements 8, 9 and 10, 11. These elements are connected in a wheatstone bridge arrangement such that changes in temperature between element pairs 8, 9 and 10, 11 may be detected as a temperature differential between the sample compartments 13 and reference compartments 12, by measuring the resistance changes of elements 8, 9.

According to the preferred embodiment of the invention, the driving nodes for the bridge arrangement of the temperature sensitive elements 8, 9 and 10, 11, receives an alternating current signal from a transformer 16. The alternating current originates from the lock-in amplifier 18 which produces an alternating signal voltage. The alternating current signal may be advantageously selected to have a periodic sinusoidal rate of 130 Hz. The frequency of 130 Hz is preferred because it eliminates the resonse of the phase-lock loop circuitry to small voltage levels that may be inadvertently coupled into the sensing bridge from the standard utility line freuqency of 60 Hz or its harmonics. The effect of the phase-lock lopo system is to produce an output DC voltage only at the exact frequency as the input excitation frequency. This DC voltage is filtered to minimize small voltage changes. The speifcic frequency enhancement eiliminates response to the wide frequency band signals and the low frequency drift associated with DC excitation of the Wheatstone bridge. The transformer 16 receives the 30 volt peak-to-peak signal from an amplifier 14. Amplifier 14 is connected through a transmission gate 20 to a lock-in amplifier 18.

In accordance with the preferred embodiment illustrated in FIG. 1, the alternating signal may be pulsed through the transmission gate 20 on a periodic basis to reduce the overall level of energy being introduced into the calorimeter 7 by virtue of heating currents through the resistive elements 8, 9 and 10, 11. The preferred duty cycle for the pulsed signal is 25/120 seconds.

The bridge signal which represents the temperature differential between sample compartment 13 and reference compartment 12 is supplied to a lock-in amplifier 18. The lock-in amplifier may be of a type made by Princeton Applied Research, which provides a filtered signal representing the magnitude of the temperature differential signal. The lockin amplifier 18 phase locks the detected signal S1 with the applied signal S2 to thus provide a filtered smooth temperature differential signal integrated to provide an essentially DC signal at zero frequency difference.

In operation, as can be seen from FIGS. 2A, 2B and 2C, a pulse S3 operates the transmission gate 20. Pulse S3 has a duration of approximately 25 seconds in the preferred embodiment, and a period of 2 or more minutes. By applying a pulsed alternating current signal to the calorimeter 7 bridge, the total power dissipation within the calorimeter 7 due to the applied signal is maintained at a minimum. The transmission gate S3 provides a burst, as shown in FIG. 2B, of alternating signal current to the bridge. From the calorimeter bridge 7, the signal S1 is time coincident with the applied signal S2, and has a much smaller magnitude representing the differential temperature between the sample container 13 and reference container 12. An analog to digital converter 22 of FIG. 1 is enabled to sample the applied signal from an enable signal S4 at a rate which is smaller than the integration constant of the lock-in amplifier 18. Enable signal S4 of FIG. 2D commences approximately 10 seconds after the transmission gate signal S3 is applied, and ends prior to the removal of the transmission signal S3 such that T3-T2 is approximately 5 seconds.

The converted signal from the analog to digital converter 22 is applied via scanner 24 to the processor 25, and stored in the processor 25 memory. Thus, as can be seen from FIG. 2A, every 2 minutes or more, a sample signal from the calorimeter 7 is detected and constitutes one point on a temperature versus time profile for the differential temperature signal from calorimeter 7. Scanner 24 provides the pulses S3 and S4 timed in accordance with the timing relationship depicted in FIGS. 2A and 2D.

Figure 3:
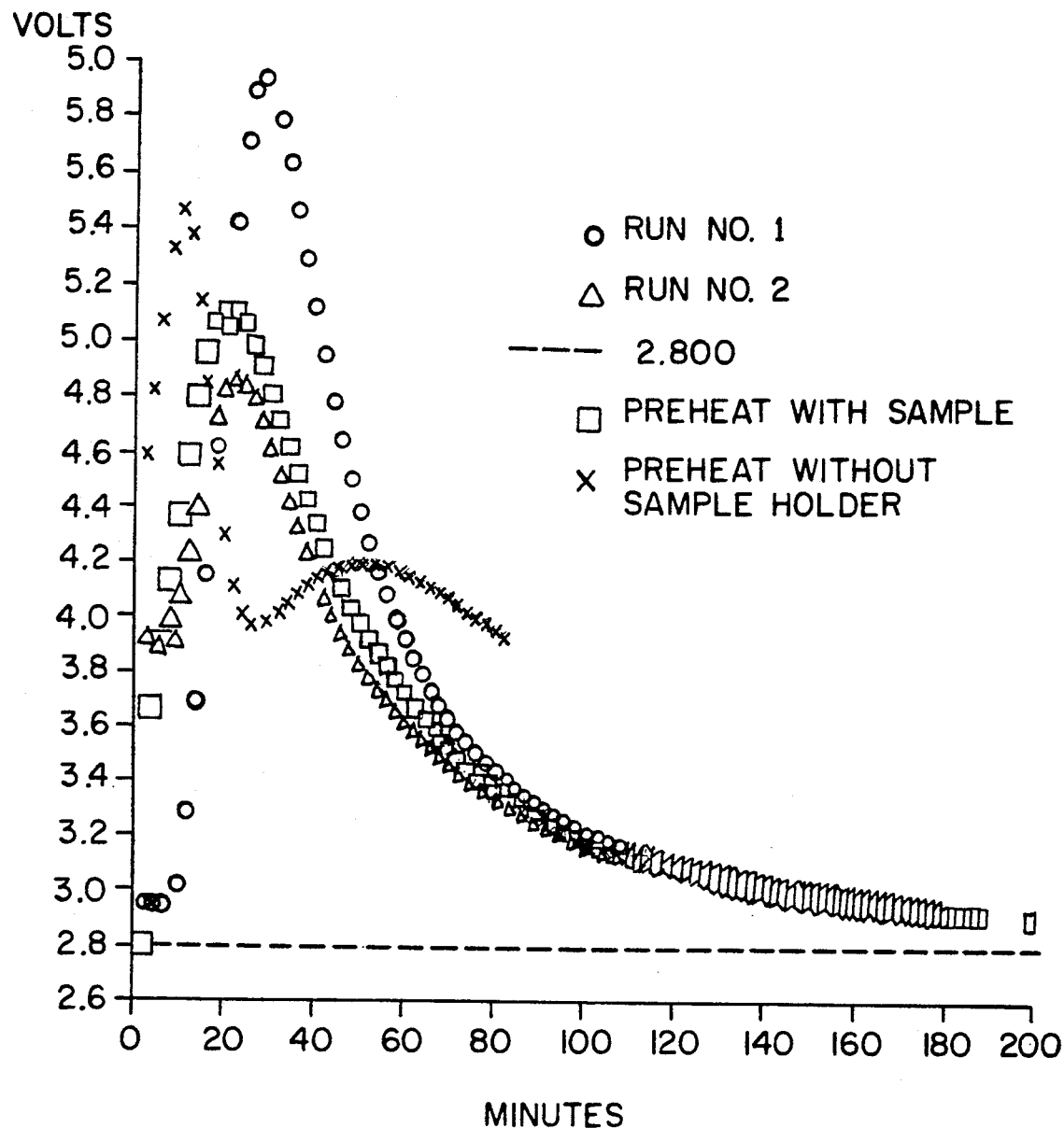
FIG. 3 illustrates the temperature decay function produced by a number of calorimeter measurements of a 1.5 watt sample.

Referring now to FIG. 3, there is shown the resulting digitized voltage signal over a time frame of approximately 180 minutes. The data represents two runs, wherein a 1.5 watt radioactive sample has been inserted in the sample chamber 13. The temperature differential rises to a peak level for each of the runs, and then decays to a steady state value which is shown to be approximately 2.8 volts.

As FIG. 3 adequately illustrates, it requires considerable time for the temperature differential signal to reach a steady state value represented by 2.8 volts. This steady state temperature differential represents the condition where 0 the amount of heat being added by the sample to the thermal circuit, comprising the sample compartment 13 and reference compartment 12, as well as the remaining thermal mass of the calorimeter 7, is equal. The time required for equilibrium resulting from heat within the sampel compartment 13, refernce compartment 12, and thermal mass of the calorimeter 7 represent the thermal cell mechanical time constant. The normal time requirement for obtaining this steady state fully decayed temperature is 18 hours.

Figure 4:
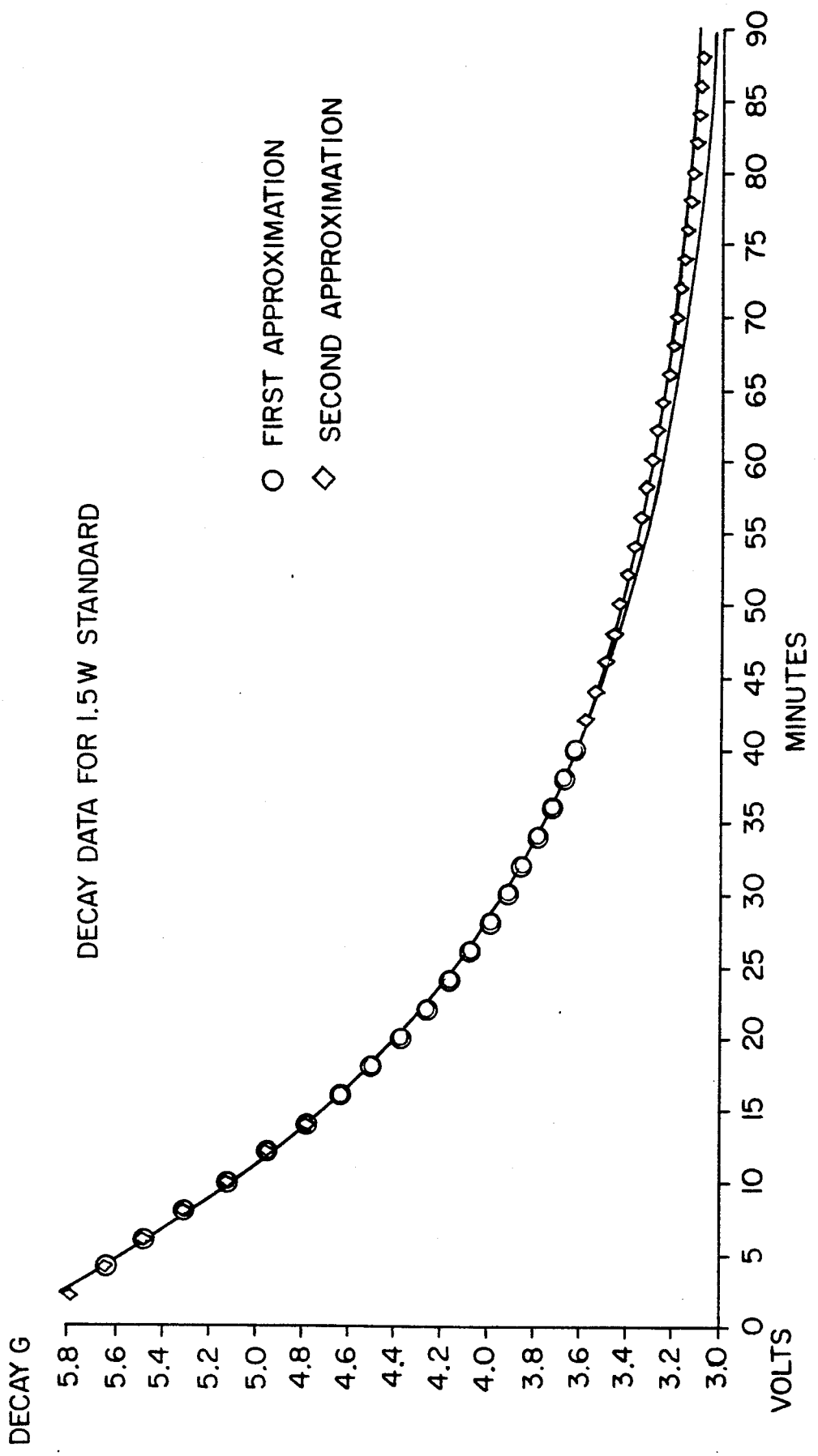
FIG. 4 illustrates a decay function obtained for the sample test of FIG. 3.

The data shown in FIG. 3, which includes two separate runs with the same 1.5 watt radioactive sample, as well as two additional runs using a preheater which is provided with the conventional calorimeter 7, can be reduced to a temperature decay profile, shown in FIG. 4.

Using a conventional computer processor 25, such as a personal computing machine, it is possible to store the sample values over a number of minutes, and using standard curve-fitting equations, provide a decay function representing the decay shown in FIG. 4. These curve-fitting algorithms will provide first and second approximations of the decay function represented by the data of FIG. 3.

The processor 25, using the decay function so established, can therefore predict the stabilization value which would be obtained after 18 hours of continuous measurement. The predicted stabilization temperature can thus be obtained long before the temperature is actually reached. The savings in operator time in making these calorimeter measurements is very clear.

A recorder printer may also be added to provide a digital clock of the data obtained during measurement of the differential temperatures. This provides for means for manual computation as well for the decay function for a given sample of radioactive material.

Thus, it is clear that the present invention will provide for distinct advantages in predicting the final stabilization temperature for a calorimeter having a radioactive sample. The noise floor for the calorimeter 7 is lowered by avoiding the consequences of supplying excessive current to the bridge elements which tend to raise the temperature of the calorimeter environment. Thus, not only may the final stabilization temperature be predicted in less time than previously required, but the measurement sensitivity is improved by lowering the thermal floor.

Those skilled in the art will recognize yet other embodiments described more particularly by the claims which follow.

What is claimed is:

1. A radionculide calorimeter system, comprising:
   (a) an isothermal twin bridge calorimeter having a sample compartment and associated sample resistive elements, said sample compartment containing a radionuclide sample, and a refernce compartment and associated reference resistive elements, said resistive elements connected in a wheatstone bridge arramgenet such that the heat output from said radionuclide sample is detected by measuring the resitance changes of said sample reisstive elements, whereupon an equlibrium temperature differential represents the condition where said heat output of said radionuclide sample is equal to the heat output of the remaining thermal mass of said calorimeter;
   (b) an alternating current source to provide current to said reistive elements;
   (c) a lock-in amplifier connected to said resistive elements to phase lock a signal from said resistive elements with a signal from said ac current source, said lock-in amplifier providing a smooth voltage proportional to the magnetitude of said signal from said resistive elements;
   (d) an analog to digital converter connected to receive said voltage and convert said voltage to a digitial signal;
   (e) compurting means for storing said digital signals and for correlating said digital signasl to a decay function for prediction of said steady state temprature differential to provde data on said radionuclide sample.

2. The radionuclide calorimeter system of claim 1 wherein said signal generator produces an alternating current having a frequqncy of 130 Hz.

3. The radionuclide calorimeter system of claim 1 further comprising means for integrating said proportional voltage with a time constant greater than the sampling time of said proportional voltage by said analog to digital converter and less than the thermal cell mechanical time constant.

4. The radionculide calorimeter sytem of claim 3 further comprising a computer processing system which calculates from a plurality of samples of said proportional voltage a time magnitude function for said proportional voltage, and from said calculated time function an equilibrium value for said proportional voltage.

5. The radionuclide calorimeter system of claim 1 wherein said signal source supplies periodic pulses of current to said bridge to effectively reduce the heat power level in said thermal cell.

6. The radionuclide calorimeter system of claim 5 wherein said pulses have a voltage magnitude of thirty volts.

7. A method for measuring the heat output of a radionculide sample comprising:
   (a) placing the radionuclide sample in a sample compartment having two associated sample resistive elements in a Wheatstone arrangeement with a refernce compartment having two associated refrence resistive elements;
   (b) applying a pulsed AC signal of a specific frequency to the resistive elements;
   (c) sampling the output signal of the same specific frequency from said sample resistive elements;
   (d) converting the output signal to a digital signal;
   (e) storing said digital signal in microprocessing compouting means;
   (f) repeating steps b through e until a steady state output signal is detercted between said resistive elements; and
   (g) integrating said digital signals to obtain a radioactive decay curve for the radionuclide sample.

8. The method of measuring the heat output of a radionuclide sample, according to claim 7 wherein a delay of substantially 15 seconds occurs between applying a pulsed AC signal and converting the output signal to a digital signal.

9. The methdo according to claim 8 wherein said step of applying a pulsed AC signal occurs periodically in intervals of 2 or mre minutes.

10. The method according to claim 9 wherein said step of applying a pulsed AC signal produces pulses of AC current having a duty cycle greater than 25/120 seconds.

11. A radionculide calorimeter, as in claim 1, wherein said dta on said radioactive sample is the total mass of the sample providing the composition is known.

* * * * *